US006668346B1

(12) United States Patent
Schulz et al.

(10) Patent No.: US 6,668,346 B1
(45) Date of Patent: Dec. 23, 2003

(54) DIGITAL PROCESS MONITOR

(75) Inventors: Jurgen M. Schulz, Pleasanton, CA (US); Tai Quan, San Jose, CA (US); Brian L. Smith, Sunnyvale, CA (US); Michael J. Grubisich, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 290 days.

(21) Appl. No.: 09/709,970

(22) Filed: Nov. 10, 2000

(51) Int. Cl.[7] .................. G01R 31/28; G01R 31/02; H03B 21/00
(52) U.S. Cl. .................. 714/724; 324/763; 327/105
(58) Field of Search .................. 714/724, 742; 324/763; 327/105

(56) References Cited

U.S. PATENT DOCUMENTS

| 5,438,599 | A | * | 8/1995 | Lincoln | 377/20 |
|---|---|---|---|---|---|
| 5,737,342 | A | * | 4/1998 | Ziperovich | 714/736 |
| 5,867,033 | A | * | 2/1999 | Sporck et al. | 324/763 |
| 5,966,021 | A | * | 10/1999 | Eliashberg et al. | 324/760 |
| 6,115,443 | A | * | 9/2000 | Wu et al. | 377/47 |
| 6,124,143 | A | * | 9/2000 | Sugasawara | 438/18 |
| 6,378,098 | B1 | * | 4/2002 | Yamashita | 714/742 |
| 6,396,312 | B1 | * | 5/2002 | Shepston et al. | 327/105 |
| 6,463,562 | B1 | * | 10/2002 | Otsuka | 714/742 |

\* cited by examiner

*Primary Examiner*—Albert Decady
*Assistant Examiner*—Anthony T. Whittington
(74) *Attorney, Agent, or Firm*—Rosenthal & Osha L.L.P.

(57) ABSTRACT

A digital process monitor for measuring the performance of an integrated circuit has been developed. The digital process monitor includes: a ring oscillator that generates a series of clocked pulses, and a ripple counter that counts the clocked pulses. The count is measured for a prescribed period of time and the count corresponds to the performance of the integrated circuit.

10 Claims, 3 Drawing Sheets

DIGITAL PROCESS MONITOR

BACKGROUND

The manufacture of integrated circuits requires rigorous testing procedures to ensure product reliability. Such testing procedures can also be applied to trouble-shooting and maintenance of the same integrated circuits once they are in use in the finished product. One measurement for an application specific integrated circuit (ASIC) is the performance of the circuit over a variance of process, voltage and temperature (PVT) conditions. This measurement can indicate whether or not the circuit is performing within the design tolerances.

Typically, a prior art analog process monitor includes an external pulse generator and an oscilloscope. As shown in the prior art example of FIG. 1, the analog process monitor 4 includes a pulse generator 6 and an oscilloscope 8. In order the measure the performance of the ASIC 2, a chain of transistor gates within the ASIC 2 are selected and the pulse generator 6 is input into this chain. The oscillator 8 then measures the delay of the output of the chain. This value is then compared to the expected value to determine whether ASIC 2 is performing as designed. As seen in FIG. 1, the analog monitor 4 in measurement is entirely external to the ASIC 2.

SUMMARY OF INVENTION

In some aspects the invention relates to an apparatus for measuring performance of an integrated circuit comprising: a ring oscillator that generates a series of clocking pulses for a prescribed period; and a ripple counter that counts the series of clocking pulses and outputs a ripple count that corresponds to the performance of the integrated circuit.

In an alternative embodiment, the invention relates to an apparatus for measuring performance of an integrated circuit comprising: means for generating an oscillating clock signal for a prescribed period; and means for counting a ripple count based on the oscillating clock signal during the prescribed period, wherein the ripple count is an indication of the performance of the integrated circuit.

In an alternative embodiment, the invention relates to a method for measuring the performance of an integrated circuit comprising: initiating an oscillating clock signal for a prescribed period; and generating a ripple count derived from the oscillating clock signal during the prescribed period, wherein in the ripple count is indicative of the performance of the integrated circuit.

The advantages of the invention include, at least, a digital process monitor that is internal to the system and calculates a value that correlates to the process variations of the integrated circuit.

DETAILED DESCRIPTION

Figure 1:
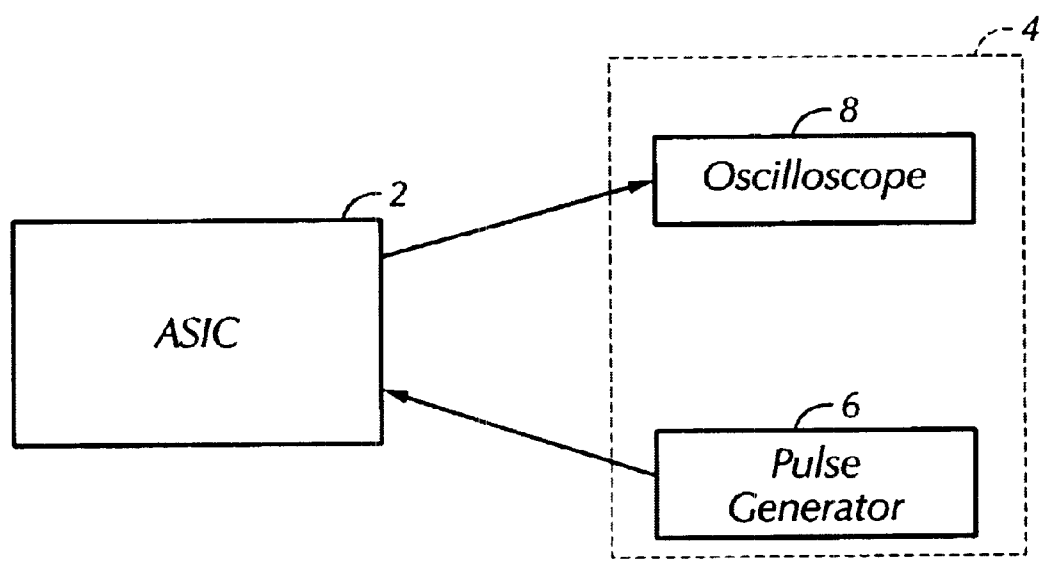
FIG. 1 shows a block diagram of a prior art analog process monitor.

Exemplary embodiments of the invention will be described with reference to the accompanying drawings. Like items in the drawings are shown with the same reference numbers.

Figure 2:
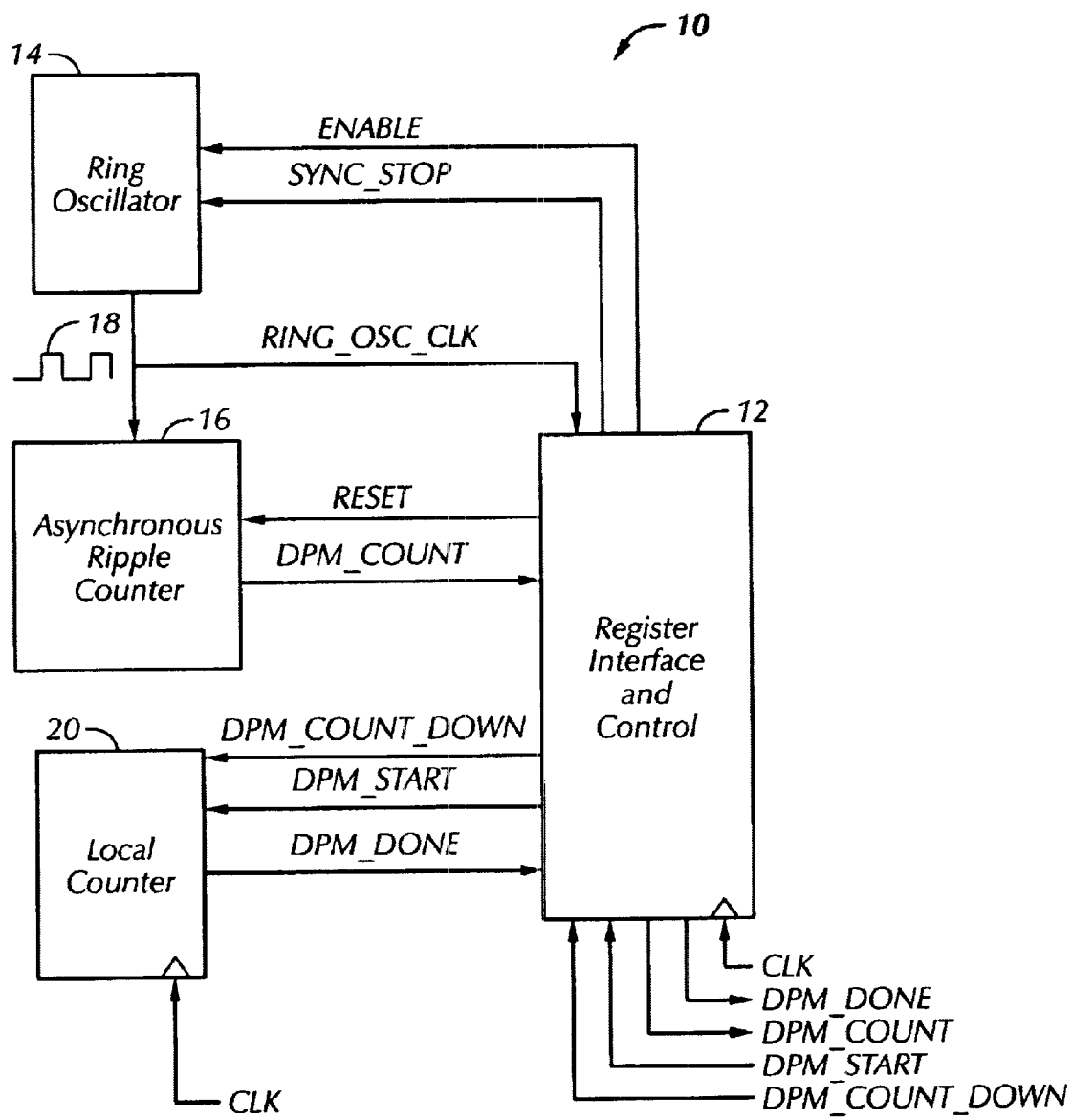
FIG. 2 shows a diagram of a digital process monitor in accordance with one embodiment of the present invention.

A digital process monitor (DPM) calculates a value that correlates to the process variations of the ASIC (i.e., the delay in pulse signal). This value may be stored inside the ASIC and read via a register access. FIG. 2 shows a block diagram of one embodiment of the present invention. The digital process monitor 10 includes: a register interface and control block 12; a ring oscillator 14; an asynchronous ripple counter 16; and a local counter 20. The local counter 20 could be either an "up" counter or a "down" counter in alternative embodiments.

The register interface and control block 12 acts as a conduit to the rest of the ASIC. The interface 12 receives the chip clock signal (CLK), the start command (DPM_START), and the period of the test cycle (DPM_COUNT_DOWN) as input from the integrated circuit and it generates the completion signal (DPM_DONE) and the value that correlates to the process variation (DPM_COUNT). During the operation of the DPM 10, the ring oscillator 14 represents the chain of silicon gates to be tested within the circuit. When the control block 12 receives DPM_START, it will generate a[n] starting signal (ENABLE) for the ring oscillator 14. Upon receiving ENABLE, the oscillator 14 begins clocking 18 (RING_OSC_CLK) the asynchronous ripple counter 16 and the control block 12. Meanwhile, DPM_START along with DPM_COUNT_DOWN are received by the local counter 20. Upon receipt of DPM_START, the counter 20 will begin to clock (according to CLK) for the duration of DPM_COUNT_DOWN. After $2^{DPM\_COUNT\_DOWN}$ clock cycles, the counter 20 reaches zero and DPM_DONE is sent to the control block 12 which stops the process. The DPM_COUNT value is sent from the ripple counter 16 to the control block 12 and on to the register (not shown). Finally, the oscillator 14 is stopped with the SYNC_STOP signal and the ripple counter 16 is "zeroed" by the. RESET signal.

In some embodiments, the DPM_COUNT value could be serially scanned out using an IEEE 1149.1 bus. In other embodiments, the DPM could be used as an "on-chip" tester so that it can be read over any range of environmental conditions wherever the circuit is used. In alternative embodiments, the DPM could be located on the printed circuit board (PCB) of the target system. In other alternative embodiments, the functions of the interface, control block, oscillator, and both counters could be combined or separated in numerous combinations. The block diagram of FIG. 2 is merely an example of one way of breaking down the functions by component.

Certain design criteria is important when implementing a DPM system. For instance, the ripple counter may be synthesized using Flip-flop circuits. One example of such circuits that may be used are D-type Negative Edge Asynchronous Reset Flip-flops. Flip-flops typically have minimum clock pulse width specification. This would require that the minimum pulse width of the ring oscillator must not exceed minimum pulse width of the flip-flops in the ripple counter. Additionally, the maximum clock frequency of the ring oscillator should not exceed the minimum chip clock frequency used to clock the local counter. This prevents the ripple counter from overflowing. Also, the ring oscillator should be arranged with a fully representative selection of transistor logic gates ("cells") from the cell library (i.e., the available set of cells within the integrated circuit) and use an interconnect range that is representative of the local interconnection. The interconnect range is the physical distance of the connection between the cells that are used. This range has a significant impact on the speed of the cells.

A design example of one embodiment of a DPM using a 0.18 $\mu$m cell library has the following criteria:

Minimum Flip-flop Pulse: 0.8 ns;
Minimum Oscillator Pulse: 1.18 ns;
Minimum Oscillator Period: 2.36 ns;
Chip Clock Period: 2.0 ns; and
Interconnection Range: 50–100 $\mu$m.

[This DPM embodiment used 622 cells from the library.] The percentage of the total usage in the ring oscillator in block 40 is shown for each cell type in the table below:

| CELL TYPE | % OF USAGE |
|---|---|
| Inverter | 30 |
| 2-Input NAND | 20 |
| 2-Input NOR | 15 |
| 2:1 Inverting MUX | 15 |
| 2-Input OR | 5 |
| 2-Input XNOR | 5 |
| 2-Input AND | 5 |
| 2-Input XOR | 5 |

Both the incremental range and the percentage of cell usage by type are calculated by statistical analysis in order to achieve a correlation between these values and the product design.

Under these criteria, the resolution of the DPM can be calculated by using the maximum (i.e., worst case) operating conditions as follows:

Maximum Oscillator Period: 6.02 ns;

Maximum Counter Period $=(2^{DPM\_COUNT\_DOWN})\times$(Chip Clock Period)$=(2^{16})=(2ns)=131$ $\mu$s;

\# of Ripple Counter Clocks=(Maximum Counter Period)/(Maximum Oscillator Period)=131 $\mu$s/6.02 ns=21.77 K Clocks; and DPM Resolution=(Maximum Oscillator Period)/(\# of Ripple Counter Clocks)=6.02 ns/21.77 K Clocks 0.28 ps.

This means that under the worst case conditions, a ring oscillator delay deviation of down to 0.28 ps can detected by this embodiment of a DPM.

Next, SPICE analysis is performed with all of these criteria to calculate an accurate number for the ring oscillator clock frequency at minimum and maximum conditions. SPICE is an auxiliary circuit simulator that is well known to those of ordinary skill in the art. SPICE will make a primitive model and prediction of the performance of the silicon logic gates of the circuit. In this instance, it is used to simulate the best and worse case of the ring oscillator frequency. The frequency range can then be used to determine a PVT range window for the ripple counter values.

Figure 3:
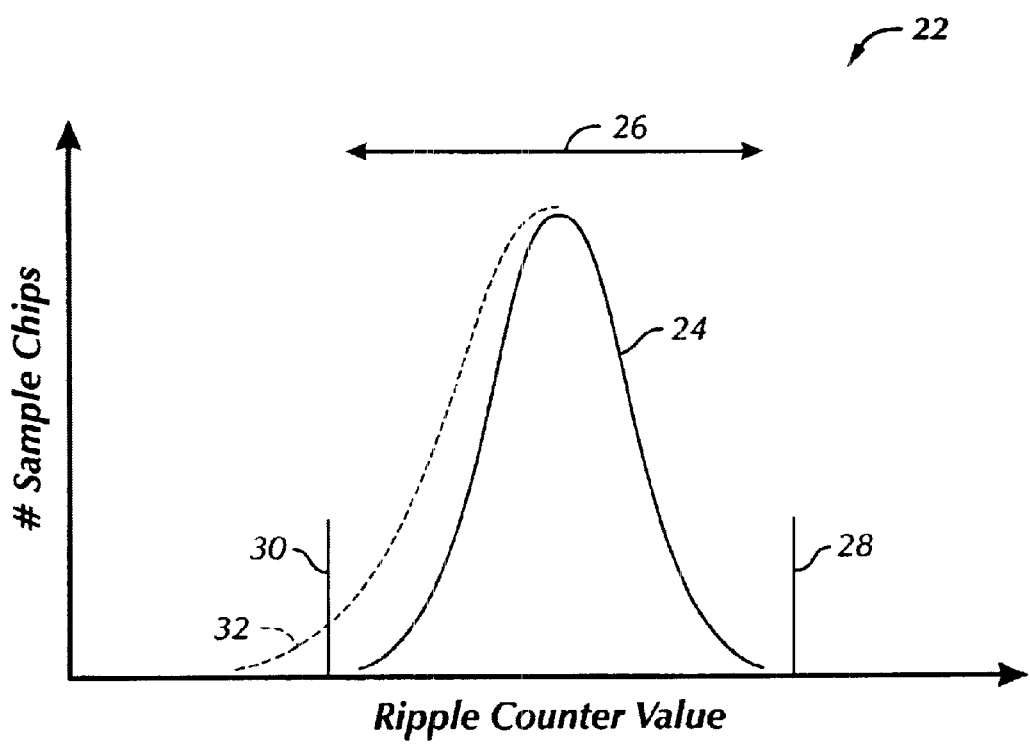
FIG. 3 shows a graph of the expected distribution curve of ripple counter values.

An example of the results of the final analysis of multiple ripple counter values is shown in FIG. 3. Specifically, FIG. 3 shows a graph 22 of the expected distribution curve 24 of ripple counter values. The PVT range window 26 is established between the best case conditions 28 and the worse case conditions 30. The curve 24 is generated as ripple counter values (x-axis) are collected for a number of sample chips (y-axis). This can be done as part of a manufacturing process testing procedure. If the ripple counter value falls within the PVT window 26, the circuit is performing within its designed range. However, if the value falls outside the window 32, the circuit is outside the design range which causes incorrect operation within the system. Such a result may be caused by various problems such as process voltage or temperature shifts outside the design range. Additionally, if the ripple counter value is read after the circuit is already in service, the behavior of the cells may have degraded over time due to process degradation.

In alternative embodiments, the monitor may be used to analyze noise in the system. In most systems, the power supply is the most common source of such. noise. The variations in the power supply voltage will cause degradation in the circuit timing. Such variations will show up as being outside the design criteria window.

The advantages of the disclosed invention includes one or more of the following: a digital process monitor that is internal to the system and calculates a value that correlates to the process variations of the integrated circuit.

While the invention has been disclosed with reference to specific examples of embodiments, numerous variations and modifications are possible. Therefore, it is intended that the invention not be limited by the description in the specification, but rather the claims that follow.

What is claimed is:

1. A digital process monitor that is internal within an integrated circuit, wherein the monitor measures performance of the integrated circuit-over varying process, voltage, and temperature conditions, the monitor comprising:

a register interface/control block;

a ring oscillator that generates an oscillating clock signal upon being enabled by the register interface/control block;

an asynchronous ripple counter that receives the oscillating clock signal and counts clock pulses of the oscillating clock signal during a prescribed period, wherein the asynchronous ripple counter generates a ripple count that corresponds to the performance of the integrated circuit; and a counter, wherein the counter dictates the prescribed period based on a result of said counter, wherein the prescribed period begins simultaneously with the ring oscillator being enabled by the register interface/control block, and wherein the ripple count is received by the register interface/control block after the prescribed period ends and the ripple count is serially scanned out to a register.

2. The digital process monitor of claim 1, wherein the ripple count is output to a register.

3. The digital process monitor of claim 1, wherein the digital process monitor is internal within the integrated circuit.

4. The digital process monitor of claim 1, wherein the digital process monitor is located on a circuit board with the integrated circuit.

5. The digital process monitor of claim 1, wherein the counter decrements to dictate the prescribed period.

6. A method for internally monitoring performance of an integrated circuit over varying process, voltage, and temperature conditions, comprising:

generating a process enable signal with a register interface/control block;

initiating an oscillating clock signal with a ring oscillator during a prescribed period upon receipt of the process enable signal from the register interface/control block;

generating a ripple count derived from the oscillating clock signal during the prescribed period with a ripple counter, wherein in the ripple count is indicative of the performance of the integrated circuit;

dictating the duration of the prescribed period with a counter, wherein the prescribed period is based on a result of said counter, and wherein the prescribed period begins simultaneously with the receipt of the enable signal by the ring oscillator; and transmitting the ripple count from the ripple counter through the register interface/control block to a register.

7. The method of claim 6, further comprising, outputting the ripple count to a register.

8. The method of claim 6, wherein the method is performed internally within the integrated circuit.

9. The method of claim 6, wherein the method is performed on a circuit board with the integrated circuit.

10. The method of claim 6, wherein the counter decrements to dictate the prescribed period.

\* \* \* \* \*